United States Patent
Kanno et al.

(10) Patent No.: US 11,853,178 B2
(45) Date of Patent: *Dec. 26, 2023

(54) STORAGE SYSTEM

(71) Applicant: Kioxia Corporation, Tokyo (JP)

(72) Inventors: Shinichi Kanno, Tokyo (JP); Hideki Yoshida, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,512

(22) Filed: Jun. 14, 2022

(65) Prior Publication Data

US 2022/0308971 A1  Sep. 29, 2022

Related U.S. Application Data

(63) Continuation of application No. 16/000,335, filed on Jun. 5, 2018, now Pat. No. 11,392,466, which is a continuation of application No. 14/700,915, filed on Apr. 30, 2015, now abandoned.

(60) Provisional application No. 62/128,678, filed on Mar. 5, 2015.

(51) Int. Cl.
G06F 11/20 (2006.01)
G06F 3/06 (2006.01)
G11C 11/00 (2006.01)

(52) U.S. Cl.
CPC .......... *G06F 11/2094* (2013.01); *G06F 3/064* (2013.01); *G06F 3/0619* (2013.01); *G06F 3/0647* (2013.01); *G06F 3/0685* (2013.01); *G06F 3/0688* (2013.01); *G06F 2201/805* (2013.01); *G11C 11/005* (2013.01)

(58) Field of Classification Search
CPC .... G06F 11/2094; G06F 3/0619; G06F 3/064; G06F 3/0647; G06F 3/0685; G06F 3/0688; G06F 2201/805; G11C 11/005
See application file for complete search history.

(56) References Cited

U.S. PATENT DOCUMENTS

| | | | |
|---|---|---|---|
| 5,729,711 | A | 3/1998 | Okamoto |
| 8,327,068 | B2 | 12/2012 | Nakanishi et al. |
| 8,775,752 | B2 | 7/2014 | Yoshida et al. |
| 2008/0082744 | A1 | 4/2008 | Nakagawa |
| 2010/0208521 | A1 | 8/2010 | Kim et al. |
| 2014/0095775 | A1 | 4/2014 | Talagala et al. |
| 2014/0157088 | A1 | 6/2014 | Chih et al. |
| 2016/0054933 | A1 | 2/2016 | Haghighi et al. |

FOREIGN PATENT DOCUMENTS

| | | |
|---|---|---|
| JP | H06-348868 A | 12/1994 |
| JP | 2003-223360 A | 8/2003 |
| JP | 2008-084270 A | 4/2008 |
| JP | 2014-110071 A | 6/2014 |
| WO | 2006/093201 A1 | 9/2006 |

*Primary Examiner* — Eric Cardwell

(74) *Attorney, Agent, or Firm* — Allen & Overy LLP

(57) ABSTRACT

According to one embodiment, a storage system includes a first storage including first nonvolatile memories storing data which is corrupted when data is read from the first nonvolatile memories, and a controller which controls the first storage. The controller reads data from a first nonvolatile memory at a first address, and determines that whether the read data is to be written back to the first storage or not.

14 Claims, 9 Drawing Sheets

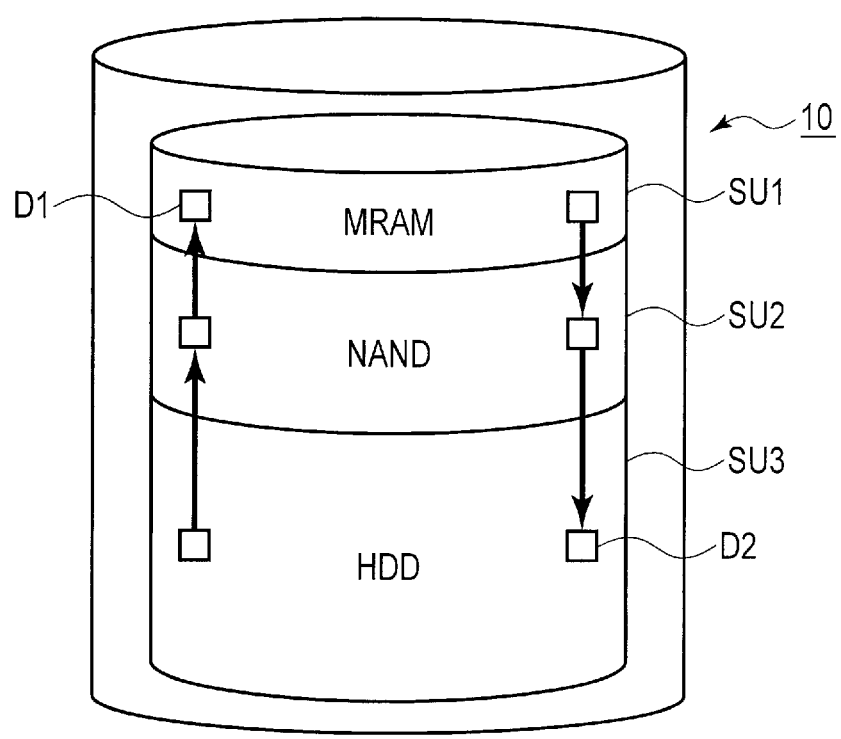
F I G. 2

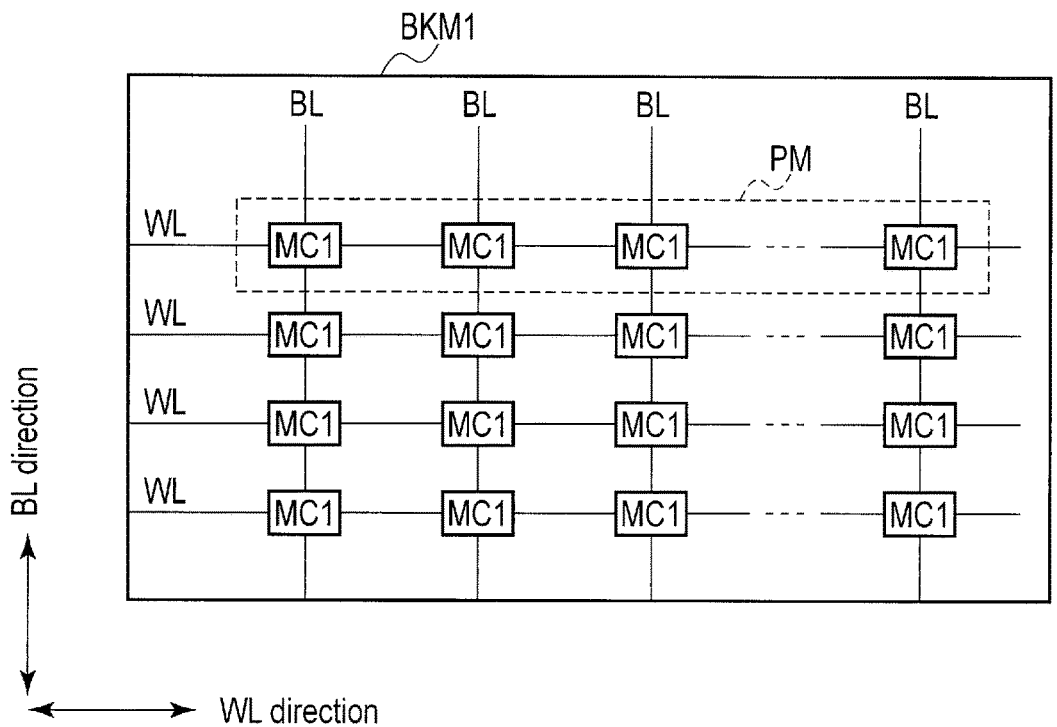
F I G. 5
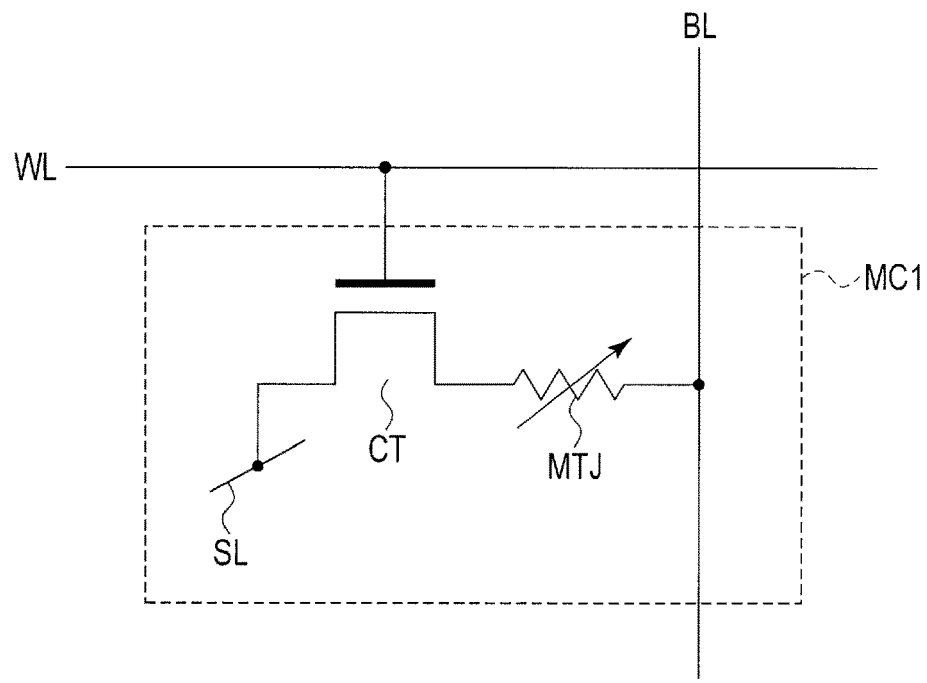
F I G. 6

STORAGE SYSTEM

CROSS-REFERENCE TO RELATED APPLICATIONS

This application is a continuation of application Ser. No. 16/000,335, filed Jun. 5, 2018, which is a continuation of application Ser. No. 14/700,915, filed Apr. 30, 2015, and is based upon and claims the benefit of U.S. Provisional Application No. 62/128,678, filed Mar. 5, 2015, the entire contents of which are incorporated herein by reference.

FIELD

Embodiments described herein relate generally to a storage system.

BACKGROUND

In a given kind of semiconductor memory, when data is read from a memory cell, data stored in the memory cell is corrupted.

BRIEF DESCRIPTION OF THE DRAWINGS

FIG. 2 is a view conceptually showing a storage system according to the first embodiment;

FIG. 5 is a block diagram showing a physical block BKM1 of the first storage unit SU1;

FIG. 6 is an equivalent circuit schematic showing a memory cell MC1 as shown in FIG. 5;

DETAILED DESCRIPTION

Figure 1:
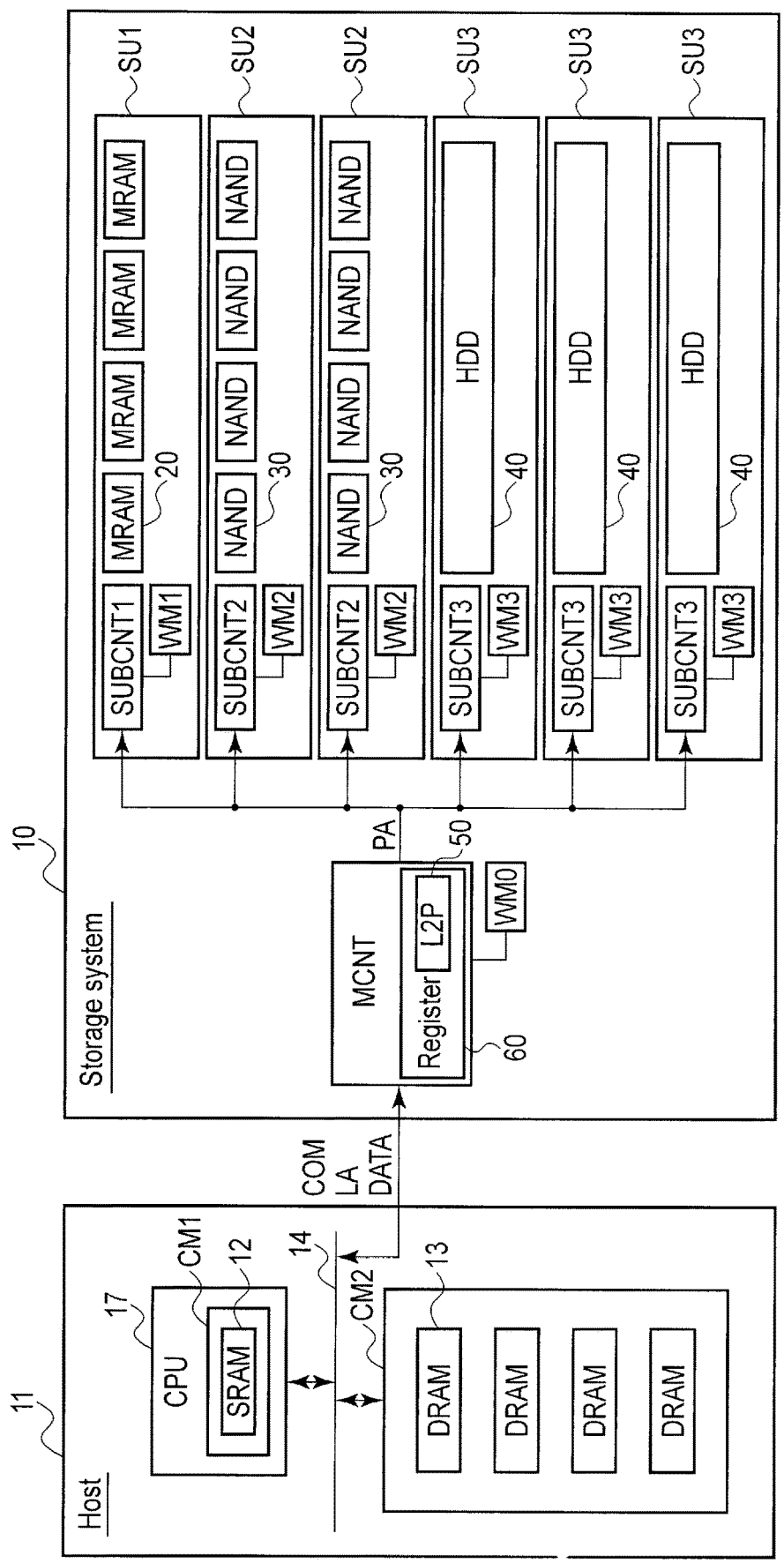
FIG. 1 is a block diagram showing an information processing system according to a first embodiment.

In general, according to one embodiment, a storage system includes a first storage including first nonvolatile memories storing data which is corrupted when data is read from the first nonvolatile memories, and a controller which controls the first storage. The controller reads data from a first nonvolatile memory at a first address, and determines that whether the read data is to be written back to the first storage or not.

Various embodiments will be described hereinafter with reference to the accompanying drawings.

With respect to each of the embodiments, structural elements which are substantially the same as or substantially the same functions as those in the other embodiments will be denoted by the same reference numerals as in the other embodiments, and after they are each explained once, a further explanation will be given only when needed. Furthermore, in the specification, some elements are described by giving various explanations. However, those explanations are also given by way of example; that is, the elements can be described with other explanations. Needless to say, the other elements may be described by explanations other than the following explanations.

First Embodiment

[1. Structure]
[1-1. Entire Structure (Information Processing System)]

The entire structure of an information processing system 1 according to the first embodiment will be explained with reference to FIG. 1.

As shown in the figure, the information processing system 1 according to the first embodiment comprises a host 11 and a storage system 10 to be controlled by the host 11.

[Host 11]

The host 11 comprises memories CM1 and CM2 and a central processing unit (CPU) 17.

The memory CM1 includes a static random access memory (SRAM) 12 which is used as a cache memory or the like of the CPU 17. The SRAM 12 is a semiconductor memory which stores data in a volatile manner. In the system 1, an access speed SP1 of the SRAM 12 is the highest. The SRAM 12 has a large size, since the number of cell transistors included in a memory cell (SRAM cell) is larger than that of a DRAM 13, etc. which will be described later. Thus, in the system 1, a data capacity of the memory CM1 including the SRAM 12 is the smallest.

The memory CM2 includes dynamic random access memories 13 (DRAMs), which are used as main memories or the like for the CPU 17 through a control line (internal bus) 14. The DRAMs 13 are semiconductor memories which store data in a volatile manner. In the system 1, the access speed SP2 of the DRAMs 13 is slower than the access speed SP1 of the SRAM 12 (SP1<SP2). The DRAMs 13 each comprise a capacitor which stores data and a transistor which selects the capacitor. In the system 1, the data capacity of the memory CM2 including the DRAMs 13 is larger than that of the memory CM1 including the memory CM2 including the SRAM 13.

The central processing unit (CPU) 17 controls an entire operation of the information processing system 1 through the control line 14. For example, in order to execute a predetermined arithmetic processing, the CPU 17 transmits a command COM, a logical address LA, data DATA, etc., to the storage system 10 through an interface, and accesses the storage system 10. When accessing it, the CPU 17 uses the memories CM1 and CM2 as a cache memory, a work memory, a main memory, etc. This will be explained in detail later.

[Storage System 10]

The storage system 10 comprises first to third storage units SU1 to SU3 and a master controller MCNT.

The first storage unit SU1 comprises a plurality of magnetic random access memories (MRAMs) 20 and a first sub-controller SUBCNT1. The first sub-controller SUBCNT1 controls each of the MRAMs 20 in a data reading operation, a data writing operation, etc. Although the first storage unit SU1 is explained on the premise that the number of first storage units SU1 is one, it is not limited to one. The MRAMs 20 are memories which store data in a nonvolatile manner. The MRAMs 20 will be explained in detail later.

The second storage units SU2 each comprise a plurality of NAND flash memories (hereinafter referred to as "NANDs") 30 and a second sub-controller SUBCNT2. The second sub-controller SUBCNT2 controls each of the NANDs 30 in a data reading operation, a data writing operation, etc. Although the second storage units SU2 are explained on the premise that the number of the second storage units SU2 is two, it is not limited to two. The NANDs 30 are semiconductor memories which store data in a nonvolatile manner. The NANDs 30 will be explained in detail later.

The third storage units SU3 each comprise a hard disk drive (HDD) 40 and a third sub-controller SUBCNT3. The third sub-controller SUBCONT3 controls the HDD 40 in a data reading operation, a data writing operation, etc. The HDD 40 comprises a magnetic disk, a head, etc., the magnetic disk including a record surface where data is stored in a nonvolatile manner, the head being provided to read data from the magnetic disk or write data to the magnetic disk. Although the third storage units SU3 are explained on the premise that the number of third storage units SU3 is three, it is not limited to three.

The master controller MCNT controls the first to third sub-controllers SUBCNT1-SUBCNT3 of the first to third storage units SU1 to SU3 based on a request from the host 11. Also, the master controller MCNT comprises a register 60 storing an address conversion table (L2P) 50.

The address conversion table 50 is a table which indicates the correspondence between logical addresses LA of input/output data managed by the host 11 and physical addresses PA managed by the storage system 10. For example, in the data reading operation or the data writing operation, if the host 11 accesses the storage system 10, the logical address LA of input/output data is converted into a physical address of any of the first to third storage units SU1 to SU3. The address conversion table 50 updates the correspondence between the logical addresses LA and the physical addresses PA in accordance with the frequency of access to the storage system 10. The address conversion table 50 will be described in detail later.

The register 60 holds the number of data rewrites and/or the number of data reads with respect to each of the logical addresses LA and each of the physical addresses PA. In the data write or the data read, if access from the host 11 is gotten, the master controller MCNT increments the number of data rewrites and/or the number of data reads with respect to the accessed logical address LA and physical address PA. The incremented number is held by the register 60.

It should be noted that each of the master controller MCNT and the first to third sub-controllers SUBCNT1 to SUBCNT3 may comprises working memories WM0, WM1, WM2 and WM3. The working memories WM0 to WM3 can be used as cache memories or the like in the case where for example, the controller MCNT and SUBCONT1 to SUBCONT3 each perform various operations. Also, it should be noted that the address conversion table 50 is stored in the register 60; however, the element which stores the address conversion table 50 is not limited to the register 60. That is, the address conversion table 50 may be stored in another memory or the like in the storage system 10, as occasion arises. Furthermore, the second storage units SU2 may be each formed as a solid-state drive (SSD) which comprises NANDs 30 and is an interface similar to the HDD 40.

[1-2. Storage System]

A conceptual structure of the storage system 10 according to the first embodiment will be explained with reference to FIG. 2.

As shown in the figure, the storage system 10 comprises the first storage unit SU1 including MRAMs 20, the second storage units SU2 including NANDs 30, and the third storage units SU3 including HDDs 40. The first storage unit SU1 is an uppermost one of layers provided in the storage system 10. The second storage unit SU2 is an intermediate one of the layers in the storage system 10. The third storage unit SU3 is a lowermost one of the layers in the storage system 10.

In the above manner, the first to third storage units SU1 to SU3 are layered; however, they can store data as a single body of the storage system 10. For example, data D1 can be stored in any of the first to third storage systems SU1 to SU3 such that they can successively store the data D1 from the third storage system SU3 to the first storage system SU1. Also, for example, data D2 can be stored in any of the first to third storage systems such that they can successively store the data D2 from the first storage system SU1 to the third storage system SU3. This will be explained in detail later.

[1-3. Address Conversion Table]

The address conversion table 50 as shown in FIG. 1 will be explained in detail with reference to FIG. 3.

As shown in the figure, in the address conversion table 50, physical addresses PA10 to PA3$m$ ($m$ is an integer) managed by the storage system 10 are associated with logical addresses LA0 to LA$n$ ($n$ is an integer) managed by the host 11.

The physical addresses PA10, PA 11, . . . are addresses assigned to the first storage unit SU1 (MRAMs 20). The physical addresses PA20, PA 21, . . . are addresses assigned to the second storage unit SU2 (NANDs 30). The physical addresses PA30, PA 31, . . . PA3$m$ are addresses assigned to the third storage units SU3 (HDDs 40).

Each of the logical addresses LA0 to LA$n$ is associated with any of the physical addresses PA10 to PA3$m$. Thereby, for example, in the data write, the master controller MCNT can convert a logical addresses LA into a physical address PA associated with the logical address LA, and write data to one of the storage units SU1 to SU3 to which the physical address PA is assigned.

Figure 3:
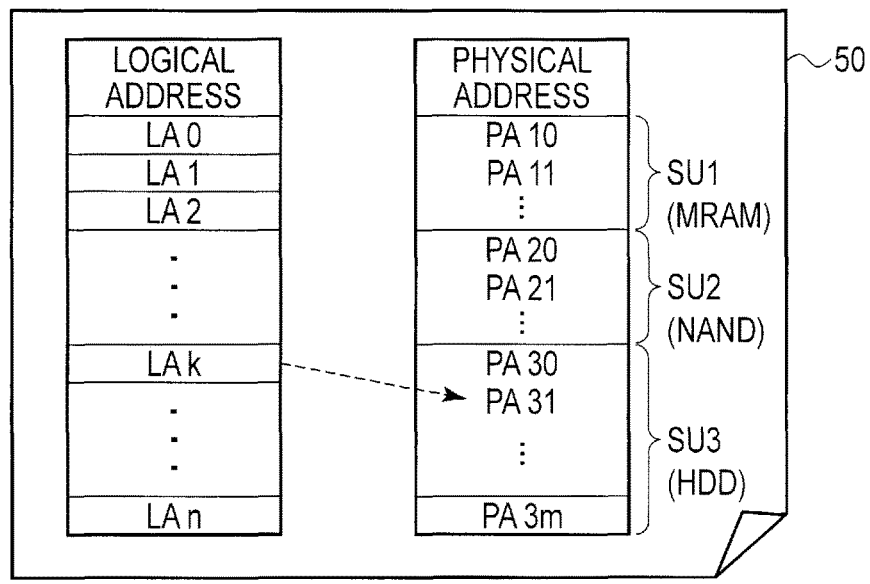
FIG. 3 is a block diagram showing an address conversion table according to the first embodiment.

For example, referring to FIG. 3, the logical addresses LA$k$ ($k$=0 to n) and the physical address PA31 are associated with each other. By referring to by way of example this case, the following explanation is given. In this case, if the host 11 gets access specifying the logical address LA$k$, the master controller MCNT converts the logical addresses LA$k$ into the physical address PA31, and accesses the HDD 40 in the third storage unit SU3 to which the physical address PA31 is assigned. If the above access is gotten to perform the data read, the third sub-controller SUBCONT3 reads data from the HDD 40 in the third storage unit SU3, which is a storage portion thereof to which the physical address PA31 is assigned. The read data is transmitted from the storage system 10 to the host 11. If the above access is gotten to perform the data write, the third sub-controller SUBCONT3 writes data to the HDD 40 in the third storage unit SU3 to which the physical address PA31 is assigned.

[1-4. First Storage Unit (MRAM)]

Figure 4:
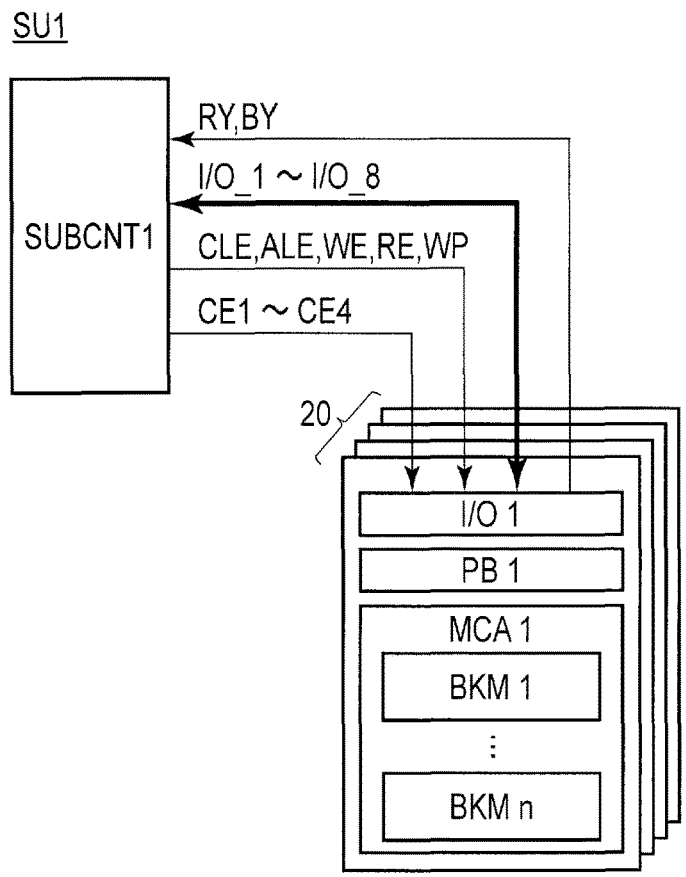
FIG. 4 is a view showing a first storage unit SU1 according to the first embodiment.

A structure of the first storage unit SU1 will be explained in detail with reference to FIG. 4.

As shown in the figure, the first storage unit SU1 comprises an input/output circuit I/O1, a page buffer PB1 and a memory cell array MCA1.

The input/output circuit I/O1 operates as an interface between the sub-controller SUBCONT1 and the first storage unit SU1. To be more specific, the input/output circuit I/O1 exchanges data DATA, control signals RY and BY, etc., which will be described later, or the like, with the sub-controller SUBCONT1.

The page buffer PB1 temporarily stores read data which is read from the memory cell array MCA1 or write data which is transmitted from the host 11.

The memory cell array MCA1 comprises a plurality of physical blocks BKM1 to BKMn. Each of the physical blocks BKM1-BKMn comprises a plurality of memory cells MC1 provided at intersections of a plurality of word lines and bit lines. The physical blocks BKM1 to BKMn will be described in detail later.

The MRAMs 20 includes CE pins to which chip enable signals CE1-CE4 are to be input, respectively. Therefore, each of the MRAMs 20 is selected when a respective one of the chip enable signals CE1 to CE4 is asserted. For example, when the chip enable signal CE1 is asserted, one of the MRAMs 20 which includes the CE pin associated with the chip enable signal CE1 is selected.

Furthermore, the MRAMs 20 include I/O pins (I/O1 to I/O8), WE pins, RE pins, CLE pins, ALE pins, WP pins, RY/BY pins, etc., in common with the NANDs 30. The I/O pins are pins for use in inputting and outputting data, an address or a command. The WE pins are pins to which a write enable signal WE is to be input. The RE pins are pins to which a read enable signal RE is to be input. The CLE pins are pins to which a command latch enable signal is to be input. The ALE pins are pins to which an address latch enable signal is to be input. The WP pins are pins to which a write protect signal is to be input. The RY/BY pins are pins from which a ready signal or a busy signal is to be output. In such a manner, according to the first embodiment, the MRAMs 20 and the NANDs 30 can also adopt the same interfaces.

[1-5. Physical Block BKM]

Physical blocks BKM included in the memory cell array MCA1 of the first storage unit SU1 will be explained with reference to FIG. 5. The following explanation is given by referring to by way of example the physical block BKM1.

As shown in the figure, the physical block BKM1 comprises a plurality of memory cells (MRAM cells) MC1 arranged in a matrix at intersections of a plurality of word lines WL and a plurality of bit lines BL. Each of the memory cells MC1 stores data in a nonvolatile manner. However, once data is read from a memory cell MC1 in an MRAM 20, data stored in the memory cell MC1 is corrupted. The memory cells MC1 will be described in detail later.

Pages PM are provided for the word lines WL, respectively. In the MRAM 20, data write and data read are performed in units of one page PM. Therefore, a page PM is a data write unit and a data read unit.

[1-6. Memory Cell MC1]

A detailed structure of the memory cells MC1 in the MRAM 20 will be explained with reference to FIG. 6.

As shown in the figure, the memory cells MC1 each comprise a resistance change element (magnetoresistive change element) MTJ and a cell transistor (switching element) CT.

The resistance change element MTJ is configured to have a resistance value which varies in accordance with a flowing direction of current in the resistance change element MTJ. One of ends of the resistance change element MTJ is connected to a bit line BL, and the other is connected to one (drain) of ends of a current path of the cell transistor CT.

The cell transistor CT is configured to control the flowing direction of current in the resistance change element MTJ by changing the flowing direction. A control terminal (gate) of the cell transistor is connected to a word line WL. The above end (drain) of the current path is connected to the above other end of the resistance change element MTJ, and the other end (source) of the current path is connected to a source line SL.

For example, in the above structure, when the word line WL is selected, the current path of the cell transistor CT is turned on. In this on state, a control circuit controls a flowing direction of current between the bit line BL and the source line SL, thereby also controlling the flowing direction of the current in the resistance change element MTJ.

[1-7. Device Structure of Memory Cell MC1]

The device structure of each of the memory cells MC1 in the MRAM 20 will be explained with reference to FIG. 7.

As shown in the figure, each memory cell MC1 in the MRAM 20 comprises a cell transistor CT and a resistance change element MTJ, which are provided in an interlayer insulating film on a semiconductor substrate 11.

The source of the cell transistor CT is provided on a source line SL on the semiconductor substrate 11. A channel region CH of the cell transistor CT is also provided on the source line SL. A gate insulating film of the cell transistor CT is provided to cover a peripheral portion of the channel region CH. A gate electrode CG (WL) is provided on a gate insulating film 15 in such a manner as to surround the channel region CH. A drain region D is provided on the channel region CH.

The channel region CH is formed of, for example, a columnar p-type silicon. The source line SL and the drain region D are formed of, for example, an n-type silicon. The gate electrode CG is formed of, for example, polysilicon. In such a manner, the cell transistor CT according to the first embodiment is formed as an n-type surrounding gate transistor (SGT).

Furthermore, in the first embodiment, source lines SL, which are associated with respective columns of resistance change elements MTJ, are isolated from each other, thus reducing parasitic capacitances of the source lines SL. Thereby, the MRAM 20 can be operated at a higher speed.

A resistance change element MTJ is provided on the drain region D, and its lower end is electrically connected to the drain region D. The resistance change element MTJ comprises a recording layer (free layer) F, a fixed layer (pinned layer) P and a tunnel insulating film B. In the recording layer F, a magnetization direction (spin direction) SPF thereof is variable (an upward direction or a downward direction) in a surface perpendicular direction. In the fixed layer P, a magnetization direction (spin direction) SPS thereof is fixed (the upward direction in this case) in the surface perpendicular direction.

The recording layer F and the fixed layer P are formed of magnetic substance such as Co, Fe, Ni, Pt, Fe, Pd, B, Ta, Dy, Tv, Cr or the like. The tunnel insulating film B is formed of insulating material which is a nonmagnetic substance, such as magnesium oxide or aluminum oxide. It should be noted that the tunnel insulating film B is formed to have a very small thickness as compared with the recording layer F and the fixed layer P, so as not to interfere with flowing of current between the recording layer F and the fixed layer P.

[Data Write to and Data Read from Memory Cell MC1]

It will be briefly explained how data is written to and read from the memory cell MC1 having the above structure.

In the following explanation, as the resistance change element MTJ according to the first embodiment, a spin transfer torque (STT) type of resistance change element is described by way of example. In the STT type of resistance change element MTJ, its magnetic resistance changes because of a spin-polarized tunnel effect, and data is thus stored.

In the fixed layer P, the magnetization direction SPS is fixed. In the recording layer F, the magnetization direction SPF is variable in the surface perpendicular direction. The memory cell MC1 stores data, utilizing a feature of the resistance change element MTJ in which the resistance value of the resistance change element MTJ changes in accordance with the magnetization direction SPF of the recording layer F. To be more specific, the resistance change element MTJ can enter a low resistance state or a high resistance state in accordance with the magnetization configuration of the fixed layer P and the recording layer F, which serve as two ferromagnetic layers.

For example, if the low resistance state of the resistance change element MTJ is defined as data "0", and the high resistance state of the resistance change element MTJ is defined as data "1", one-bit data can be recorded on the resistance change element MTJ. Needless to say, the low resistance state and the high resistance state may be defined as data "1" and data "0", respectively.

Figure 7:
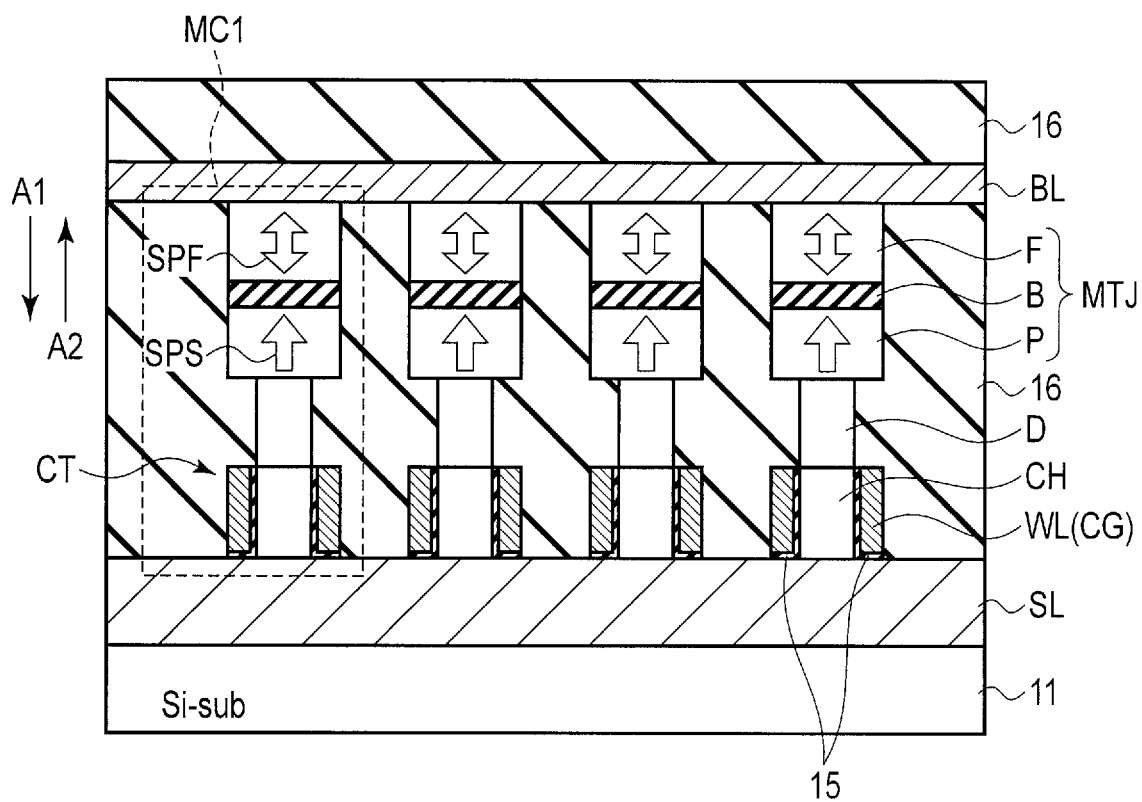
FIG. 7 is a cross-sectional view showing a device structure of memory cells MC1.

In FIG. 7, arrows in resistance change elements MTJ indicate the magnetization directions SPF and SPS. In such a manner, in the first embodiment, magnetization in the magnetization direction SPS of the fixed layer P and that in magnetization direction SPF of the recording layer F are magnetization which acts in a direction (perpendicular direction) crossing a surface of the semiconductor substrate 11 (such magnetization will be hereinafter referred to as "perpendicular magnetization"). Resistance change elements MTJ whose magnetization is perpendicular magnetization as described above can be arranged at a higher density than resistance change elements whose magnetization is parallel to the semiconductor substrate 11 (this magnetization will be hereinafter referred to as "in-plane magnetization").

In the above structure, if current larger than switching threshold current is made to flow from the bit line BL to the source line SL in a direction indicated by arrow A1, the magnetization direction SPF of the recording layer F becomes parallel to the magnetization direction SPS of the fixed layer P (P state). For example, in the case as shown in FIG. 7, the magnetization directions SPS and SPF are both upward. In this parallel state, the resistance change element MTJ enters the low resistance state (data "0").

On the other hand, if the current larger than the switching threshold current is made to flow from the source line SL to the bit line BL in a direction indicated by arrow A2, the magnetization direction SPF of the recording layer F is reversed (SPF: upward direction→downward direction). Thus, the magnetization directions SPF and SPS are antiparallel with each other (AP state). In this antiparallel state, the resistance change element MTJ enters the high resistance state (data "1").

In such a manner, it is possible to write data to the memory cell MC1 by utilizing the feature of the resistance change element MTJ in which the resistance value thereof changes in accordance with the flowing direction of current in the resistance change element MTJ.

Furthermore, in the data read, the current path of the cell transistor CT is turned on to cause current to flow from the source line SL to the bit line BL, and the resistance value of the resistance change element MTJ is detected by a sense amplifier. For example, if the resistance value of the resistance change element MTJ is detected as that of the low resistance state, data "0" is read out from the memory cell MC1. On the other hand, if the resistance value of the resistance change element MTJ is detected as that of the high resistance state, data "1" is read out from the memory cell MC1.

It should be noted that if data is read from a memory cell MC1 in an MRAM 20, data stored in the memory cell MC1 is corrupted. This "data corruption" can be considered to occur for the reason that in the data read, when current is made to flow in a resistance change element MTJ to detect the resistance value of the resistance change element MTJ, energy accumulated in the resistance change element MTJ is emitted therefrom to the outside. To be more specific, after the reading, the magnetization direction SPF of the recording layer F in the resistance change element MTJ is changed and destabilized due to read current flowing in the resistance change element MTJ such that the data cannot be re-read, as compared with the magnetization direction SPF of the recording layer F in the case where the reading has not yet been performed.

It should be noted that the above data corruption after the data read can occur not only in the MRAM 20, but in another semiconductor memory such as a ferroelectric random access memory (FeRAM). In the FeRAM, the data corruption can occur since the polarization of a ferroelectric which stores data is inverted in data read. Therefore, if the data corruption occurs, it is necessary that data is rewritten (written back) to the semiconductor memory.

In such a manner, the MRAMs 20 according to the first embodiment are advantageous in arrangement of elements at a higher density. Thus, it is also advantageous to apply the MRAMs 20 to the storage unit SU1 included in the storage system 10. On the other hand, when data is read from a memory cell MC1 in an MRAM 20, data stored in the memory cell MC1 is corrupted.

Furthermore, the number of times each of the memory cells MC1 in the MRAM 20 can be rewritten is limited. For example, the number of times each memory cell MC1 in the MRAM 20 can be rewritten is approximately $10^9$ (approximately $2^{30}$ in binary numeral). The number of data rewrites and the number of times data reads are recorded in the register 60, work memories WM0 to WM3 or the like.

It should be noted that the positional relationship between the fixed layer P and the recording layer F may be inverted. Furthermore, in each of the MRAMs 20 according to the first embodiment, the resistance change elements MTJ and the cell transistors CT are stacked together in the perpendicular direction to the surface of the semiconductor substrate 11. Therefore, the layout area of each MRAM 20 can be reduced, and elements can be provided at a higher density. For example, the layout area of a memory cell MC1 as shown in FIG. 7 is $4F^2$. F (feature size) is the smallest possible line width which an element can be formed in a semiconductor manufacturing process.

[1-8. Structure of Physical Block BKN]

Figure 8:
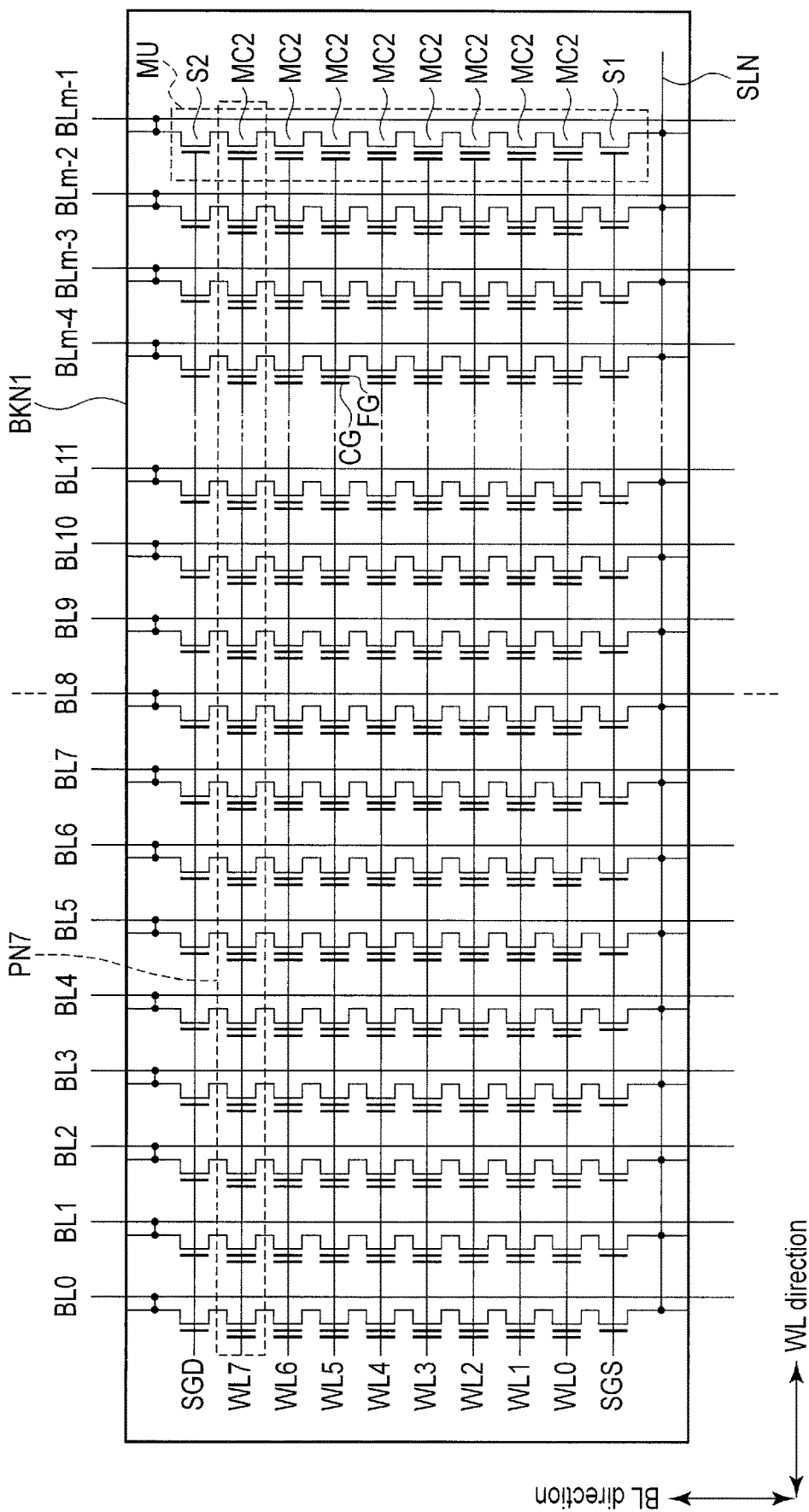
FIG. 8 is an equivalent circuit schematic showing a physical block BKN1 of a second storage unit SU2.

Physical blocks BKN included in the NANDs 30 will be explained with reference to FIG. 8. The following explanation is given by referring to by way of example a single physical block, i.e., physical block BKN1.

As shown in the figure, a physical block BKN1 in a NAND 30 comprises a plurality of memory cell units MU extending in a bit-line direction. The memory cell units MU each comprise a NAND string (memory cell string) including eight memory cells MC2 connected in series in their current path, a select transistor S1 connected to one of ends of the current path of the NAND string on a source side thereof, and a select transistor S2 connected to the other end of the current path of the NAND string on a drain side thereof. The memory cells MC2 include control gates CG and floating gates FG. It should be noted that although it is described above that the memory cell units MU each include 8 memory cells MC2, the structure of each memory cell MU is not limited to such a structure. It suffices that each memory cell unit MU includes two or more memory cells MC2, for example, 56 memory cells or 32 memory cells.

Ends of current paths which are located close to selection transistors S1 each provided on the above source side are connected to a single source line SLN. The other ends of the current paths which are located close to selection transistors S2 each located on the above drain side are connected to bit lines BL0 to BLm−1, respectively.

Each of word lines WL0 to WL7 is connected in common to control gates CG of a respective plurality of memory cells MC2 arranged in a word-line direction. A selection gate line SGS is connected in common to gate electrodes of the selection transistors S1, which are arranged in the word-line direction. Also, a select gate line SGD is connected in common to gate electrodes of the select transistors S2, which are arranged in the word-line direction.

Furthermore, pages PN are provided for the word lines WL0 to WL7, respectively. For example, as surrounded by a dashed line, a page PN7 is provided for the word line WL7. In units of one page PN7, the data read and the data write are performed. Thus, a page PN is a data write unit and a data read unit.

It should be noted that in the physical block BKN1, data erasure is performed at a time. Thus, in each of the NANDs 30, the physical block BKN is a data erasure unit.

[2. Operation]

[2-1. Data Read]

Next, in the above structure, the data read of the storage system 10 according to the first embodiment will be explained. The explanation will be given by referring to by way of example the data read of the storage unit SU1 with reference to FIG. 9.

In step S11, the sub-controller SUBCONT1 reads data RD1 in units of one page PM from an MRAM 20 in the storage unit SU1. As described above, read data RD1 stored in memory cells MC1 in a page PM subjected to the data read is corrupted. It should be noted that the sub-controller SUBCONT1 increments the number of data reads, and records the incremented number in the work memory WM1.

In step S12, the sub-controller SUBCONT1 determines whether data RD1 is to be rewritten (written back) to the above page PM in the MRAM 20 in the storage unit SU1 or not. More specifically, the sub-controller SUBCONT1 refers to the number of data writes, which is recorded in the work memory WM1, and determines whether the number of data writes with respect to the address of the above page PM exceeds a predetermined threshold value or not.

In step S13, if it is determined that the data RD1 is not to be written back to the storage unit SU1 (No in Step 12), the controllers SUBCONT1 and MCNT select other storage units, i.e., storage units SU2 and SU3, to which the data RD1 is to be written. This is because in the above case, it is determined that the number of data writes to the MRAMs 20 reaches an upper limit (or it is close to the upper limit).

To be more specific, the sub-controller SUBCONT1 notifies the master controller MCNT that the number of data rewrites exceeds the threshold value. After being notified, the master controller MCNT refers to the work memories WM2 and WM3 of the storage units SU2 and SU3, and selects an address for which the number of data rewrites is smaller than that for any other address. For example, if the number of times the data re-writing operation is performed on page PN1 of a NAND 30 in the storage unit SU2 is smaller, the master controller MCT notified of the above controls the sub-controller SUBCONT2 to write the data RD1 to the storage unit SU2.

Figure 10:
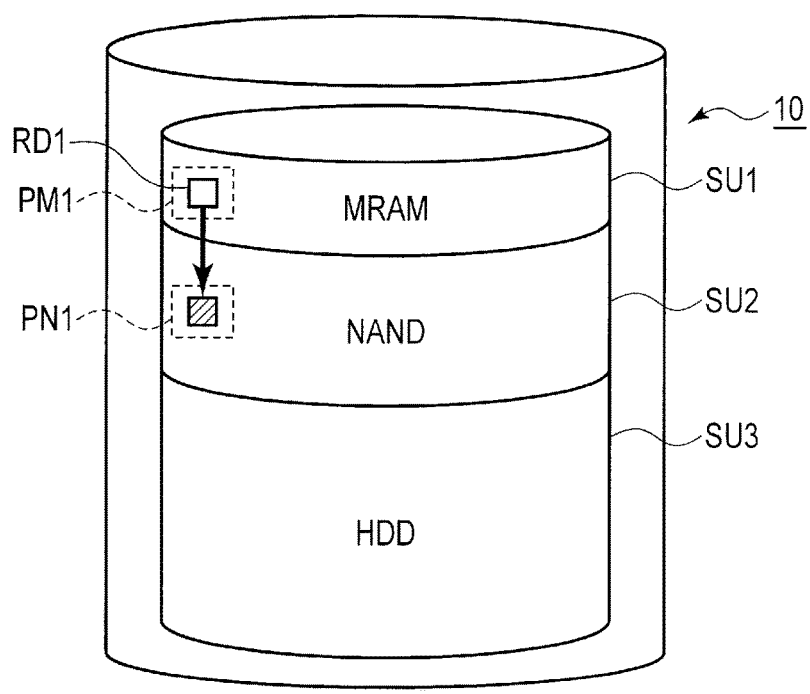
FIG. 10 is a view for explaining data transfer (S14) as indicated in FIG. 9.

In step S14, the sub-controllers SUBCONT2 and 3 writes the data RD1 to the selected other storage units, i.e., the storage units SU2 and SU3. For example, in the above case, the sub-controller SUBCONT2 writes the data RD1 to the page PN1 in the NAND 30 in the storage unit SU2, for which the number of data rewrites is smaller. As a result, as shown in FIG. 10, the data RD1 which was stored in page PM1 in the MRAM 20 in the storage unit SU1 is written to page PN1 in the storage unit SU2, which is a lower layer in level than the storage unit SU1.

In step S15, the master controller CNT updates the address conversion table 50 since the data writes is performed in the step S14. For example, as shown in FIG. 3, the master controller MCNT updates physical addresses (PA10, PA11, . . . ) of the storage unit SU1 which are associated with the page PM1, to physical addresses (PA20, PA21, . . . ) of the storage unit SU2 which are associated with the page PN1.

In step S16, if it is determined that the data RD1 is to be written back to the storage unit SU1 (Yes in S12), the sub-controller SUBCONT1 further updates the location (page address) of part of the storage unit SU1 to which the data RD1 is to be written. To be more specific, in the above case, the sub-controller SUBCONT1 refers to the work memory WM1, and selects a page address for which the number of rewrites is smaller than that for any other page address. For example, if the number of data rewrites to page PM2 in an MRAM 20 in the storage unit SU1 is smaller, the sub-controller SUBCONT1 selects the page PM2 in the NAND 20 in the storage unit SU1.

Figure 11:
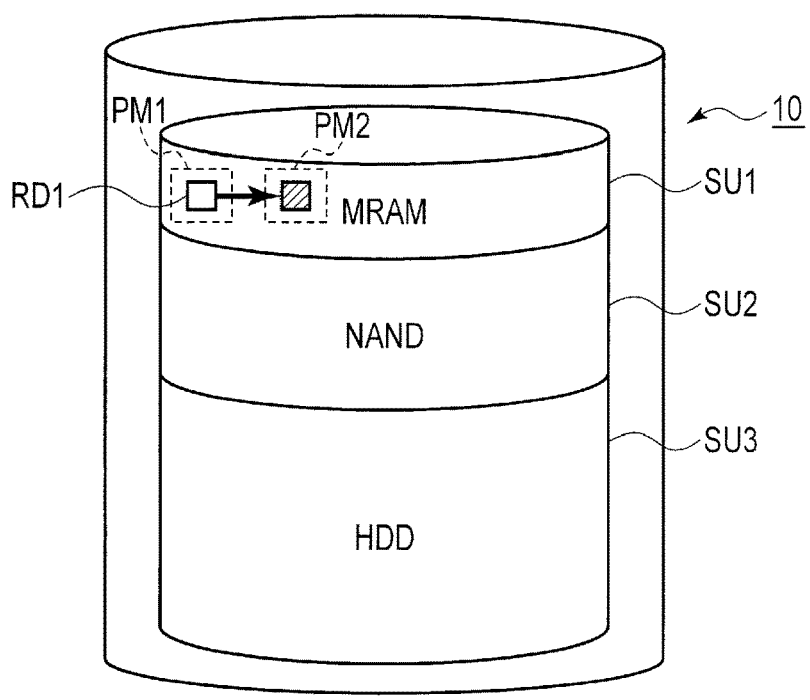
FIG. 11 is a view for explaining another data transfer (S17) as indicated in FIG. 9.

In step S17, the sub-controller SUBCONT1 writes the data RD1 to the selected location (page address). For example, in the above case, the sub-controller SUBCONT1 writes the data RD1 to the page PM2 in the MRAM 20 in the storage unit SU1, for which the number of data rewrites is smaller. As a result, as shown in FIG. 11, the data RD1 which was stored in the page PM1 in the MRAM 20 in the storage unit SU1 is written to page PM2 in the MRAM 20 in the storage unit SU1.

In step S18, the master controller MCNT updates the address conversion table 50 since the data write is performed in step S17. For example, as shown in FIG. 3, the master controller MCNT updates it to change the physical address of a location to be applied in the storage unit SU1 from the physical address of the page PM1 in the storage unit SU1 to the physical address of the page PM2 in the storage unit SU1.

[3. Advantages]

As explained above, by virtue of the structure and operation of the information processing system 1 according to the first embodiment, the following advantages (1) and (2) can be obtained.

(1) The lives of the storage memories in the storage system 10 can be increased.

It should be noted that if data is read from a memory cell MC1 an MRAM 20 or the like, data stored in the memory cell MC1 is corrupted. Furthermore, in each of the memory cells MC1 in the MRAMs 20, the number of data writes is limited. Thus, if data read from a memory cell MC1 is simply written back to the memory cell MC1, the number of writes to the memory cell MC1 is increased, and the life thereof is shortened.

Figure 9:
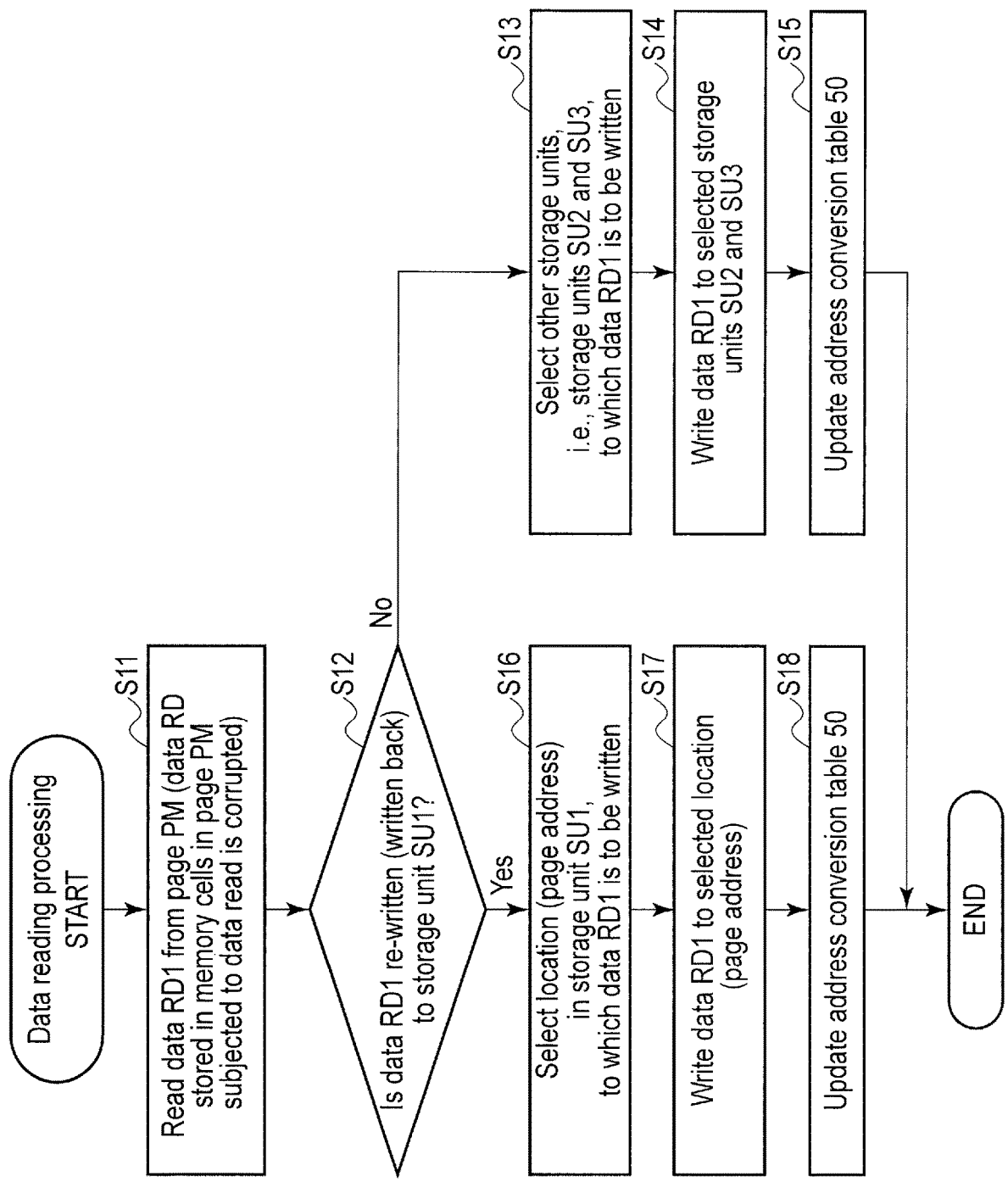
FIG. 9 is a flowchart showing a data reading operation according to the first embodiment.

In view of the above, the sub-controller SUBCONT1 in the storage system 10 according to the first embodiment determines, after reading data RD1 from a memory cell MC1, whether or not data RD1 is to be rewritten (written back) to a page PM1 in an MRAM 20 in the storage unit SU1, in which the above memory cell MC1 is provided (S12 in FIG. 9).

Furthermore, if it is determined that the data RD1 is not to be rewritten, the sub-controllers SUBCONT2 and SUBCONT3 write the data RD1 to other storage units, i.e., storage units SU2 and SU3 (S13 and S14). For example, the sub-controller SUBCONT2 writes the data RD1 to page PN1 in a NAND 30 in the storage unit SU2, for which the number of rewrites is smaller (FIG. 10).

On the other hand, if it is determined that the data RD1 is to be written back to the MRAM 20, the sub-controller SUBCONT1 selects a page different from the page PM1, i.e., the page PM2, for which the number of data rewrites is smaller than that in any other page, and writes the data RD1 to the page PM2 (S16 and S17). For example, the sub-controller SUBCONT1 writes the data RD2 to the page PM2 in the MRAM 20 in the storage unit SU1, for which the number of data rewrites is smaller (FIG. 11).

In such a manner, in the storage system 10 according to the first embodiment, after reading data RD1 from an MRAM 20 in the storage unit SU1, the address (PN1, PM2) of a location where the RD1 is to be written is specified to rewrite data RD1 to the MRAM 20. In this specification of the address, an address of a location to which data such as the number of data writes will be written with a low possibility is specified.

Therefore, it is possible to prevent a given memory cell (MC1 or the like) from being concentratedly written, and equalize data write to locations of the storage system 10 (wear leveling). As a result, the lives of the storage memories SU1 to SU3 in the storage system 10 can be increased.

(2) In the memory architecture of the information processing system 1, the relationship between the access speed and the data capacity can be optimized.

The information processing system 1 according to the first embodiment comprises various memories such as the memories CM1 and CM2 and the storage memories SU1 to SU3. Thus, regarding the information processing system 1 according to the first embodiment, the relationship between the access speed and the data capacity will be explained with reference to FIG. 12. It should be noted that in the data read, the "access speed (latency)" is determined based on a time period from the time at which a command from the host 11 is input to a memory to the time at which read data is output from the memory, and in the data write, the "access speed (latency)" is determined based on a time period from the time at which a command from the host 11 is input to a memory to the time at which write data is input to the memory. "Data capacity" is the data size in which data can be written to a memory.

Figure 12:
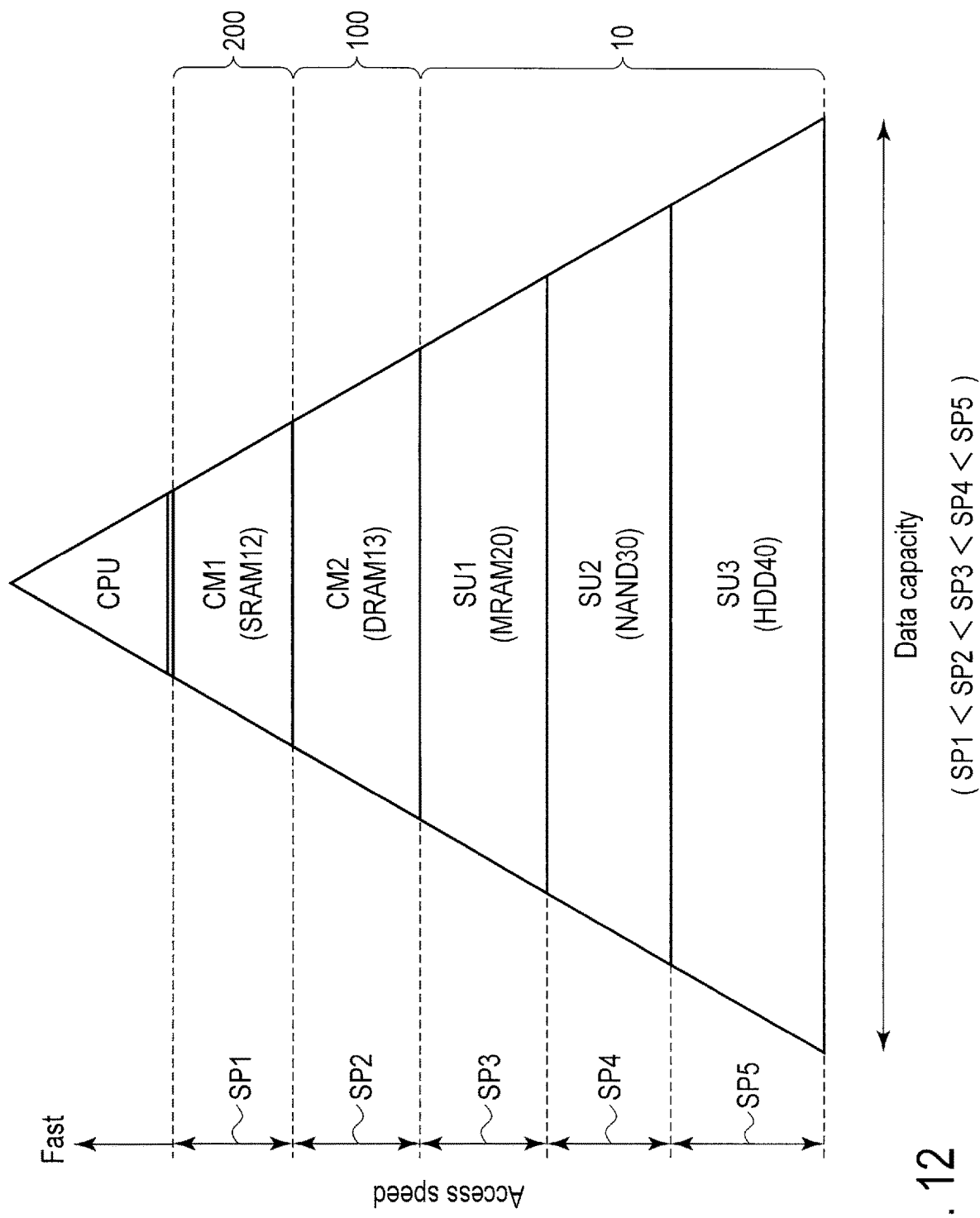
FIG. 12 is a view schematically showing the relationship between access speed and data capacity in a memory architecture of the information processing system according to the first embodiment.

As shown in FIG. 12, the access speed of each of the memories CM1-CM1 and SU1 to SU3 of the information processing system 1 is set such that the closer the location to the CPU 17, the faster the value of the access speed (the higher the access speed (the access speed: SP1<SP2<SP3<SP4<SP5).

For example, the access speed SP1 of the memory CM1 (SRAM 12) is approximately several nanoseconds. The access speed SP2 of the memory CM2 (DRAM 13) is approximately several tens of nanoseconds. The access speed SP3 of the storage unit SU1 (MRAMs 20) is approximately several microseconds. The access speed SP4 of the storage unit SU2 (NANDs 30) is approximately several hundreds microseconds. The access speed SP5 of the storage unit SU3 (HDD 40) is approximately several tens of milliseconds.

In such a manner, the difference (gap) between the access speeds of the memories CM1 to CM2 and SU1 to SU3 included in the information processing system 1 can be reduced.

Furthermore, the data capacity of each of the memories CM1 to CM1 and SU1 to SU3 in the information processing system 1 is set such that the closer the location to the CUP 17, the smaller the value of the data capacity (the data capacity: SRAM 12<DRAM 13<MRAM 20<NAND (SSD) 30<HDD 40).

In such a manner, according to the first embodiment, in the memory architecture of the information processing system 1, the relationship between the access speed and the data capacity can be optimized.

In addition, the MRAMs 20, the NANDs 30 and the HDDs 40 included in the storage units SU1 to SU3 in the storage system 10 all store data in a nonvolatile manner. Therefore, even when power is not supplied to the storage system 10, the data is held in the storage units SU1 to SU3. Accordingly, it is possible to provide a normally-off type of storage system 10 which does not need power when it is not used.

(Modification 1)

The embodiment is not limited to the first embodiment, and the embodiment can be modified as occasion demands, as follows. It should be noted that in the following description concerning the modification, detailed explanations of structures and operations identical to those in the first embodiment are omitted.

[Storage Unit SU1]

MRAMs 20 in a storage unit SU1 are not limited to the MRAMs 20 as explained with respect to the first embodiment. For example, memory cells MC1 may be located in intersections of word lines WL and bit lines (BL, bBL) which are complementary to each other. By virtue of this structure, the read speed of the memory cells MC1 can be made higher. For example, a resistance effect element MTJ in each of the memory cells MC1 may be provided as a resistance effect element whose magnetization is in-plane magnetization in which magnetization acts in parallel with the semiconductor substrate 11. In such a manner, it is possible to apply MRAMs 20 which are modified as occasion demands.

Furthermore, memories in the storage unit SU1 are not limited to MRAMs 20; that is, as the memories, any kind of nonvolatile memories may be provided as long as at least data in them can be corrupted. Also, as the storage unit SU1, for example, another type of semiconductor memory such as a resistance random access memory (ReRAM), a ferroelectric random access memory (FeRAM) or an ovonic unified memory (OUM) can be applied.

[Data Read of Storage Unit SU1]

The data read of the storage unit SU1 is not limited to that of the first embodiment.

For example, in step S13, if it is determined that data is not to be rewritten to the storage unit SU1 (No in S12), at the time of performing a page-in operation, the controllers MCNT and SUBCONT1 to SUBCONT3 may set a dirty flag for data which will be rewritten with a high possibility. In this case, the controllers MCNT and SUBCONT1 to SUBCONT3 may write dirty data at the time of performing a page-out operation. Furthermore, in step S16, if it is determined that data is to be written back to the storage unit SU1 (Yes in S12), the controller SUBCONT1 may write data which will be re-written with a low possibility, to a location at another address at the time of performing the page-in operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage system comprising:
   a first storage including a first nonvolatile memory, the first nonvolatile memory being capable of storing data thereto and reading the data therefrom;
   a second storage including a second nonvolatile memory and being capable of storing data; and
   a controller configured to control the first storage and the second storage,
   wherein
   the controller is configured to:
   read data from a first address of the first nonvolatile memory of the first storage, wherein the action of reading data from the first nonvolatile memory corrupts the data being stored at the first address of the first nonvolatile memory of the first storage;
   determine whether or not the read data is to be rewritten to the first storage;
   write the read data to a second address of the second nonvolatile memory of the second storage, when it is determined that the read data is not to be rewritten to the first storage, and
   write the read data to either the first address or a third address of the first nonvolatile memory of the first storage, when it is determined that the read data is to be rewritten to the first storage.

2. The storage system of claim 1, wherein the controller is configured to determine whether or not the read data is to be rewritten to the first storage, based on the number of times data is written to the first address of the first nonvolatile memory.

3. The storage system of claim 1, further comprising a third storage storing data, a data capacity of the third storage being larger than a data capacity of the second storage.

4. The storage system of claim 3, wherein the third storage is an HDD.

5. The storage system of claim 1, further comprising an address conversion table indicative of correspondence between logical addresses managed by a host and physical addresses managed by the storage system.

6. The storage system of claim 5, wherein the controller is configured to update the address conversion table after writing the read data to the second address of the second nonvolatile memory of the second storage.

7. The storage system of claim 6, wherein in the address conversion table, the controller is configured to update a first physical address corresponding to the first address to a second physical address corresponding to the second address.

8. The storage system of claim 5, wherein the controller is configured to update the address conversion table after writing the read data to the third address of the first nonvolatile memory of the first storage.

9. The storage system of claim 8, wherein in the address conversion table, the controller is configured to update a first physical address corresponding to the first address to a third physical address corresponding to the third address.

10. The storage system of claim 1, wherein the first nonvolatile memory includes:
    a resistance change element including a resistance value which varies in accordance with a flowing direction of current in the resistance change element; and
    a switching element which switches the flowing direction of the current in the resistance change element.

11. The storage system of claim 10, wherein the resistance change element includes:
    a free layer including a magnetization direction which varies in accordance with the flowing direction of current in the free layer;
    a pinned layer including a fixed magnetization direction; and
    a tunnel insulating film provided between the free layer and the pinned layer.

12. The storage system of claim 1, wherein the first storage is an MRAM.

13. The storage system of claim 1, wherein the second storage is a NAND flash memory.

14. A controlling method of a storage system comprising a first storage and a second storage, the first storage including a first nonvolatile memory, the first nonvolatile memory being capable of storing data thereto and reading the data therefrom, the second storage including a second nonvolatile memory and being capable of storing data, the controlling method comprising:
    reading data from a first address of the first nonvolatile memory of the first storage, wherein the action of reading data from the first nonvolatile memory corrupts the data being stored at the first address of the first nonvolatile memory of the first storage;
    determining whether or not the read data is to be rewritten to the first storage;
    writing the read data to a second address of the second nonvolatile memory of the second storage, when it is determined that the read data is not to be rewritten to the first storage, and
    writing the read data to either the first address or a third address of the first nonvolatile memory of the first storage, when it is determined that the read data is to be rewritten to the first storage.

\* \* \* \* \*